(12) United States Patent
Wang et al.

(10) Patent No.: US 8,537,513 B2
(45) Date of Patent: Sep. 17, 2013

(54) ESD PROTECTION CIRCUIT FOR NEGATIVE-POWERED INTEGRATED CIRCUIT

(75) Inventors: Wen-Tai Wang, Hsinchu County (TW); Ming-Jing Ho, Taipei (TW)

(73) Assignee: Global Unichip Corp., Hsinchu Science Park, Hsinchu (TW)

( * ) Notice: Subject to any disclaimer, the term of this patent is extended or adjusted under 35 U.S.C. 154(b) by 115 days.

(21) Appl. No.: 12/978,622

(22) Filed: Dec. 26, 2010

(65) Prior Publication Data

US 2012/0162831 A1 Jun. 28, 2012

(51) Int. Cl.
*H02H 9/00* (2006.01)
(52) U.S. Cl.
USPC ............................................................ 361/56

(58) Field of Classification Search
USPC ........................................ 361/56, 57, 58, 59
See application file for complete search history.

(56) References Cited

U.S. PATENT DOCUMENTS

| | | | | |
|---|---|---|---|---|
| 5,708,549 | A * | 1/1998 | Croft | 361/56 |
| 5,774,318 | A * | 6/1998 | McClure et al. | 361/56 |
| 6,327,126 | B1 * | 12/2001 | Miller et al. | 361/56 |
| 6,385,028 | B1 * | 5/2002 | Kouno | 361/111 |
| 2007/0091521 | A1 * | 4/2007 | Hsueh et al. | 361/56 |
| 2012/0162832 | A1 * | 6/2012 | Wang et al. | 361/56 |

* cited by examiner

*Primary Examiner* — Rexford N Barnie
*Assistant Examiner* — Angela Brooks
(74) *Attorney, Agent, or Firm* — Winston Hsu; Scott Margo

(57) ABSTRACT

For a negative-powered IC, an ESD protection circuit includes a negative voltage clamping circuit configured to provide a path for discharging ESD transient currents associated with different negative power supplies of the IC.

6 Claims, 4 Drawing Sheets

US 8,537,513 B2

ESD PROTECTION CIRCUIT FOR NEGATIVE-POWERED INTEGRATED CIRCUIT

BACKGROUND OF THE INVENTION

1. Field of the Invention

The present invention is related to an ESD protection circuit, and more particularly, to an ESD protection circuit for negative-powered integrated circuits.

2. Description of the Prior Art

Electrostatic discharge (ESD) is a major source of reliability failures in integrated circuits (ICs). ESD arises when electrostatic charge accumulated on one object (for example a human body or a piece of equipment) is conducted onto a second object (for example a circuit board). This conduction of charge often results in damages to ICs, whether through electrical over-voltage stress or through thermal stress caused by large currents.

With recent progress in VLSI technology, the largely miniaturized ICs become more and more susceptible to ESD damage. Therefore, various ESD protection structures have been placed near input, output, or bi-directional I/O pins of ICs. Many of these protection structures use passive components such as series resistors and thick-oxide transistors. Another type of ESD structure uses an active transistor to safely shunt ESD transient current.

FIG. 1 is a diagram illustrating a prior art ESD protection circuit 100. The ESD protection circuit 100 includes a voltage clamping circuit 10 and diodes D1-D2. The voltage clamping circuit 10, biased by a positive power supply VDD and a ground supply GND, is turned off during normal powered operation. When a positive ESD zap or pulse is applied to, or is somehow coupled to, a power node PAD of an IC, the rapid rise in voltage on the power node PAD turns on the diode D1 and the voltage clamping circuit 10. The ESD transient current may thus be shunted to ground, thereby preventing the IC from possible ESD damages.

Conventional ESD protection structures, however, are effective primarily in devices with a single positive power supply VDD for digital signals. For IC's with mixed signals, i.e. digital and analog signals, negative power supply busses are sometimes required. Thus, there is a need for an ESD protection circuit which may provide adequate ESD protection in negative-powered ICs.

SUMMARY OF THE INVENTION

The present invention provides an ESD protection circuit for use in a negative-powered integrated circuit. The ESD protection circuit includes a negative voltage clamping circuit biased by a first power supply and a second power supply and configured to provide a discharging path, wherein the first power supply is at a negative level and the second power supply is at a level higher or equal to a ground level; a first path-controller coupled between a first negative power node of the integrated circuit and the first power supply of the negative voltage clamping circuit for allowing a first ESD transient current to be shunted via the discharging path, wherein the first ESD transient current is induced when a first negative voltage lower than the first power supply is presented to the first negative power node; and a second path-controller coupled between the negative power node and a positive power supply.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
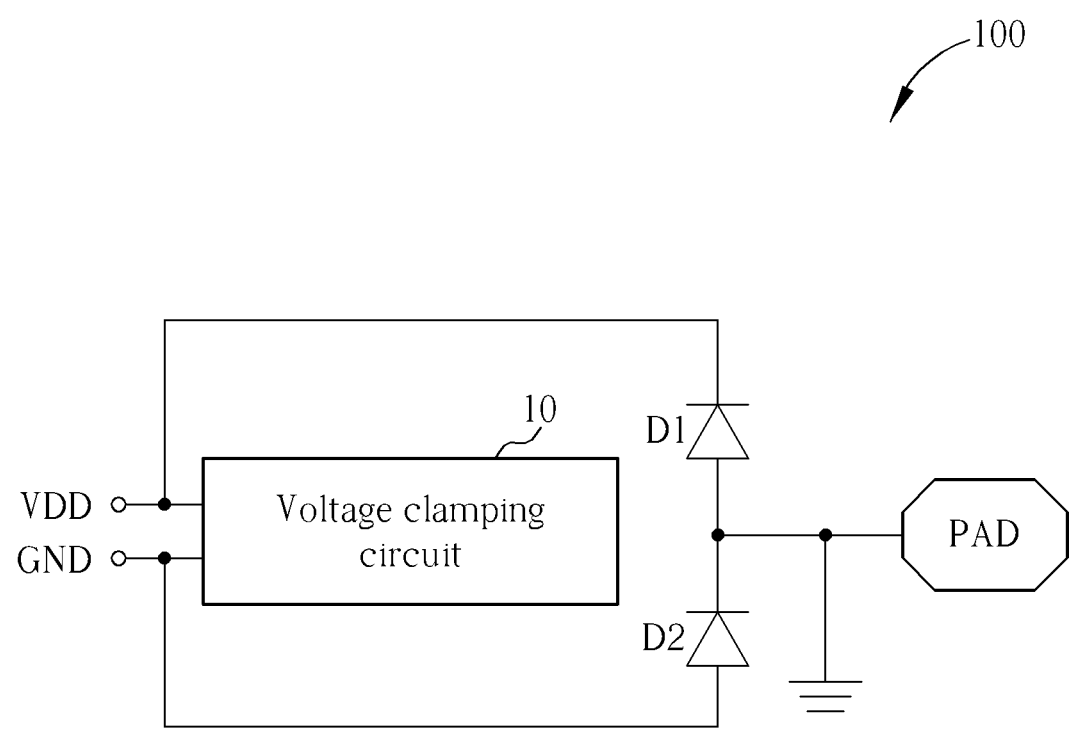
FIG. 1 is a diagram illustrating a prior art ESD protection circuit.
Figure 2:
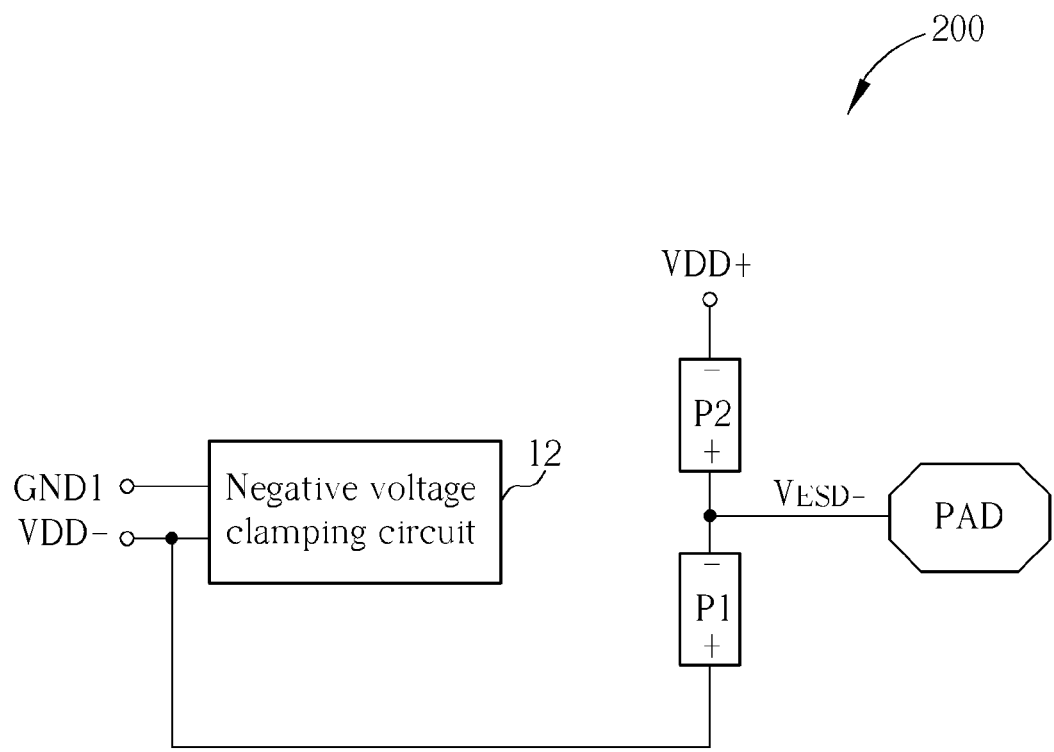
FIG. 2 is a diagram illustrating an ESD protection circuit according to a first embodiment of the present invention.

FIG. 2 is a diagram illustrating an ESD protection circuit 200 according to a first embodiment of the present invention invention. The ESD protection circuit 200 includes a negative voltage clamping circuit 12 and two path-controllers P1-P2. The negative voltage clamping circuit 12, biased by a negative power supply VDD- and a ground supply GND1 (or a power supply higher than ground level), is turned off during normal powered operation. The path-controller P1 is a two-terminal device having a positive terminal coupled to the VDD- bus of the negative voltage clamping circuit 12 and a negative terminal coupled to a negative power node PAD- of an IC. The path-controller P2 is a two-terminal device having a positive terminal coupled to the negative power node PAD- and a negative terminal coupled to a positive power supply VDD+.

In response to a negative ESD zap $V_{ESD-}$ applied to or somehow coupled to the power node PAD-, the present ESD protection circuit 200 is configured to protect the IC from possible damages. IF the absolute value of the ESD zap $V_{ESD-}$ exceeds a threshold, the path-controller P1 is forward-biased, allowing the ESD zap $V_{ESD-}$ to turn on the negative voltage clamping circuit 12. The ESD transient current associated with the ESD zap $V_{ESD-}$ may thus be shunted to the ground bus GND, thereby preventing the IC from possible ESD damages. Therefore, the present invention may provide robust ESD protection for a negative power supply.

Figure 3:
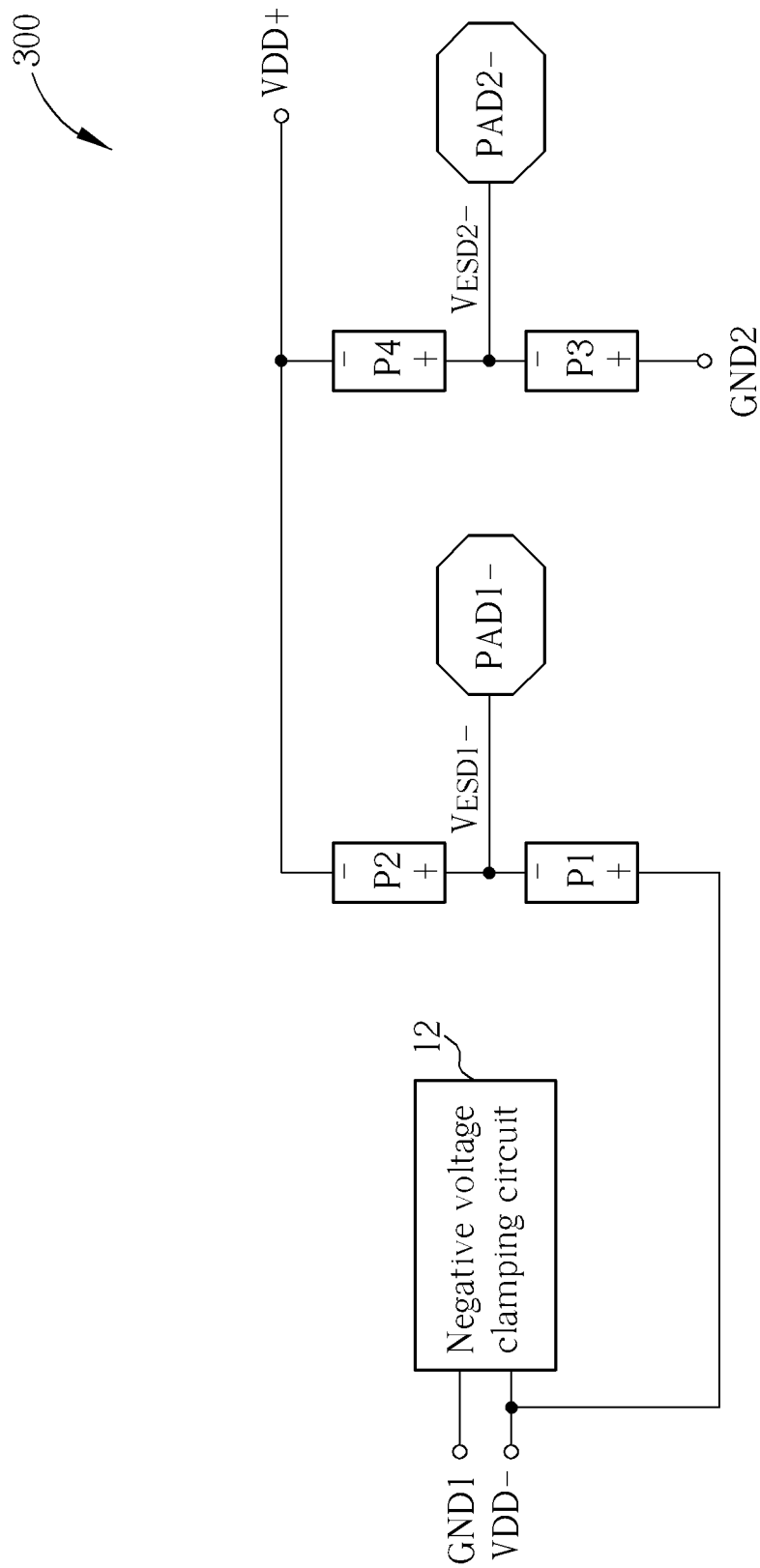
FIG. 3 is a diagram illustrating an ESD protection circuit according to a second embodiment of the present invention.

FIG. 3 is a diagram illustrating an ESD protection circuit 300 according to a second embodiment of the present invention. The ESD protection circuit 300 includes a negative voltage clamping circuit 12 and four path-controllers P1-P4. The negative voltage clamping circuit 12, biased by a negative power supply VDD- and a ground supply GND1, is turned off during normal powered operation. In the embodiment illustrated in FIG. 3, the value of VDD- may be determined according to the IC which is configured to operate according to multiple negative power supplies.

The path-controller P1 is a two-terminal device having a positive terminal coupled to the VDD- bus of the negative voltage clamping circuit 12 and a negative terminal coupled to a first negative power node PAD1- of an IC. The path-controller P2 is a two-terminal device having a positive terminal coupled to the first negative power node PAD1- and a negative terminal coupled to a positive power supply VDD+. The path-controller P3 is a two-terminal device having a positive terminal coupled to a ground supply GND2 and a negative terminal coupled to a second negative power node PAD2- of the IC. The path-controller P4 is a two-terminal device having a positive terminal coupled to the second negative power node PAD2- and a negative terminal coupled to the positive power supply VDD+. The path-controllers P1-P4 may be any two-terminal device which is configured to provide a low-impedance path when the voltage across its positive terminal and negative terminal exceeds its threshold voltage. Examples of such path-controllers include, but not limited to, diodes, metal-oxide-semiconductor (MOS) transistors, field oxide devices, bipolar junction transistors (BJTs), or silicon controlled rectifiers (SCRs).

The ESD circuit 300 may be used in the IC which operates according to multiple negative power supplies received at its power nodes PAD1− and PAD2−. In response to an ESD zap $V_{ESD1-}$ presented to the power node PAD1− or an ESD zap $V_{ESD2-}$ presented to the power node PAD2−, the present ESD protection circuit 300 is configured to protect the IC from possible damages. IF the absolute value of the ESD zap $V_{ESD1-}$ exceeds a threshold, the path-controller P1 is forward-biased, allowing the ESD zap $V_{ESD1-}$ to turn on the negative voltage clamping circuit 12. The ESD transient current associated with the ESD zap $V_{ESD1-}$ may thus be shunted to the ground bus GND1, thereby preventing the IC from possible ESD damages. IF the absolute value of the ESD zap $V_{ESD2-}$ exceeds a threshold, the path-controller P2 is forward-biased, allowing the ESD transient current associated with the ESD zap $V_{ESD2-}$ to be shunted to the ground bus GND2, thereby preventing the IC from possible ESD damages. Therefore, the present invention may provide robust ESD protection for multiple negative power supplies.

Figure 4:
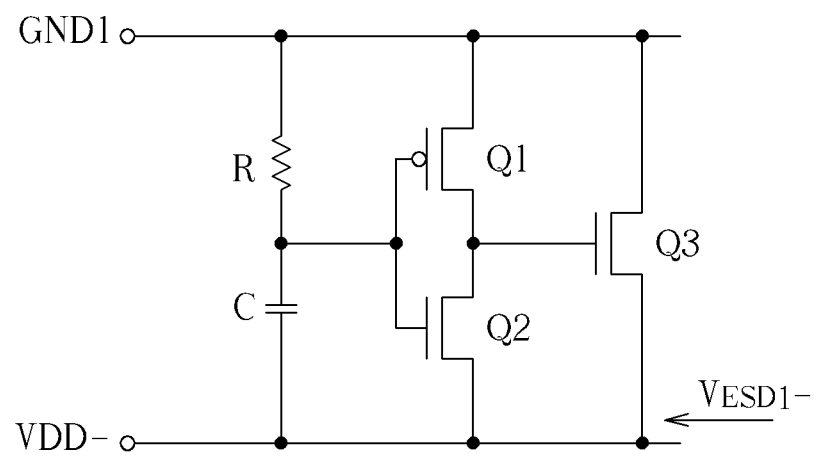
FIG. 4 is a diagram illustrating an embodiment of the negative voltage clamping circuit 12.

FIG. 4 is a diagram illustrating an embodiment of the negative voltage clamping circuit 12. In this embodiment, the voltage clamping circuit includes a capacitor C, a resistor R, a p-channel transistor Q1, an n-channel transistor Q2 and an n-channel shunt transistor Q3. During normal powered operation, the top plate of the capacitor C is charged to ground through the resistor R. The high voltage (with respect to VDD−) on the gates of the transistors Q1-Q2 turns on the n-channel transistor Q2 and turns off the p-channel transistor Q1, causing the gate of the n-channel shunt transistor Q3 to be driven low. Therefore, the n-channel shunt transistor Q3 remains off during normal powered operation.

When the ESD zap $V_{ESD1-}$ is presented to the first negative power node PAD1−, the rapid drop in voltage is transmitted to the VDD− bus via the forward-biased path-controller P1, thereby causing the drains of the n-channel transistor Q2 and n-channel shunt transistor Q3 to drop quickly. However, the gate of the n-channel transistor Q2 does not drop as quickly because of the R-C time constant delay caused by discharging of the capacitor C through the resistor R. Similarly, the gate of n-channel shunt transistor Q3 does not drop as quickly since it may be connected to the VDD− bus only after the n-channel transistor Q2 is turned on. Therefore, with its gate-to-source voltage increases in absolute value in response to the ESD zap $V_{ESD1-}$, the n-channel shunt transistor Q3 is turned on, thereby shunting the ESD current from the VDD− bus to the GND bus.

The embodiment illustrated in FIG. 4 is only for illustrative purpose and does not limit the scope of the present invention. The negative voltage clamping circuit 12 may adopt various structures well-known to those skilled in the art. The ground supplies GND1 and GND2 are depicted as two separate buses, but may be connected to a common ground terminal in packages, printed circuited boards or chips in which the negative voltage clamping circuit 12 is integrated. Also, the negative voltage clamping circuit 12 may be used for providing ESD protection for an IC which operates according to one or more negative power supplies.

The present invention provides an ESD protection circuit which provides a path for discharging ESD transient currents associated with different negative power supplies of an IC. Therefore, an IC using the present ESD protection circuit may have better ESD susceptibility.

Those skilled in the art will readily observe that numerous modifications and alterations of the device and method may be made while retaining the teachings of the invention.

What is claimed is:

1. An ESD (electrostatic discharge) protection circuit for use in a negative-powered integrated circuit, comprising:
a negative voltage clamping circuit biased by a first power supply and a second power supply and configured to provide a discharging path, wherein the first power supply is at a negative level and the second power supply is at a level equal to a ground level;
a first path-controller coupled between a first negative power node of the integrated circuit and the first power supply of the negative voltage clamping circuit for allowing a first ESD transient current to be shunted via the discharging path, wherein the first ESD transient current is induced when a first negative voltage lower than the first power supply is presented to the first negative power node; and
a second path-controller coupled between the negative power node and a positive power supply higher than the ground level.

2. The ESD protection circuit of claim 1 wherein:
the negative voltage clamping circuit is turned on for providing the discharging path when a voltage across the first path-controller exceeds a first threshold.

3. The ESD protection circuit of claim 1 wherein the first and the second path-controllers include diodes, metal-oxide-semiconductor (MOS) transistors, field oxide devices, bipolar junction transistors (BJTs), or silicon controlled rectifiers (SCRs).

4. The ESD protection circuit of claim 1 further comprising:
a third path-controller coupled between a second negative power node of the integrated circuit and a ground supply; and
a fourth path-controller coupled between the second negative power node and the positive power supply.

5. The ESD protection circuit of claim 4 wherein the third and the fourth path-controllers include diodes, MOS transistors, field oxide devices, BJTs, or SCRs.

6. The ESD protection circuit of claim 1 wherein the negative voltage clamping circuit includes a capacitor, a resistor, a p-channel transistor, an n-channel transistor and an n-channel shunt transistor.

* * * * *